(12) United States Patent
Mozak et al.

(10) Patent No.: US 8,331,176 B2
(45) Date of Patent: Dec. 11, 2012

(54) METHOD AND SYSTEM FOR EVALUATING EFFECTS OF SIGNAL PHASE DIFFERENCE ON A MEMORY SYSTEM

(75) Inventors: Christopher P. Mozak, Beaverton, OR (US); Kevin B. Moore, Chapin, SC (US); John V. Lovelace, Irmo, SC (US); Zale Theodore Schoenborn, Portland, OR (US); Bryan L. Spry, Portland, OR (US); Christopher E. Yunker, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 322 days.

(21) Appl. No.: 12/628,103

(22) Filed: Nov. 30, 2009

(65) Prior Publication Data

US 2011/0131458 A1    Jun. 2, 2011

(51) Int. Cl.
G11C 29/00    (2006.01)

(52) U.S. Cl. .................. 365/201; 365/191; 365/189.02; 365/210.12; 365/233.1

(58) Field of Classification Search .................. 365/201, 365/191, 189.02, 210.12
See application file for complete search history.

(56) References Cited

U.S. PATENT DOCUMENTS

| | | | |
|---|---|---|---|
| 5,982,161 A | 11/1999 | Nguyen et al. | |
| 6,052,307 A | 4/2000 | Huber et al. | |
| 6,069,471 A | 5/2000 | Nguyen | |
| 6,104,651 A * | 8/2000 | Cowles et al. | ................ 365/201 |
| 6,353,403 B1 | 3/2002 | Williams | |
| 6,499,131 B1 | 12/2002 | Savithri et al. | |
| 6,680,642 B2 | 1/2004 | Edell et al. | |
| 6,969,976 B1 | 11/2005 | Broach et al. | |
| 7,036,053 B2 | 4/2006 | Zumkehr et al. | |
| 7,299,380 B2 | 11/2007 | Miller | |
| 7,417,459 B2 | 8/2008 | Wilson et al. | |
| 7,489,121 B2 | 2/2009 | Qiu | |
| 7,541,795 B1 | 6/2009 | Smith | |
| 7,853,842 B2 | 12/2010 | Kim | |
| 2004/0123207 A1 | 6/2004 | Zumkehr et al. | |
| 2005/0259774 A1 * | 11/2005 | Garlepp | ........................ 375/355 |
| 2010/0001703 A1 | 1/2010 | Williams | |

OTHER PUBLICATIONS

U.S. Appl. No. 12/638,887, filed Dec. 15, 2009, Whole Document.
Non-Final Office Action mailed Jan. 6, 2012 for U.S. Appl. No. 12/638,887.
Non-Final Office Action for U.S. Appl. No. 12/638,887, mailed May 16, 2012, Whole Document.
Notice of Allowance for U.S. Appl. No. 12/638,887, mailed Jun. 6, 2012, Whole Document.

* cited by examiner

*Primary Examiner* — Thong Q Le
(74) *Attorney, Agent, or Firm* — Blakely, Sokoloff, Taylor & Zafman LLP (57) ABSTRACT

In an embodiment, the effect of signal phase difference on a memory system is tested for various operating states. The various operating states may be represented as respective sample points on a plane defined by a range of values for a difference in signal phases and a range of values for another operating state parameter. In various embodiments, sample points for a round of crosstalk testing may include two sample points which are offset from the same reference point on the plane along different respective axes, where the axes are oblique to one another.

19 Claims, 8 Drawing Sheets

METHOD AND SYSTEM FOR EVALUATING EFFECTS OF SIGNAL PHASE DIFFERENCE ON A MEMORY SYSTEM

BACKGROUND

1. Technical Field

This disclosure relates to operation of a memory system. More particularly, this disclosure relates to techniques for evaluating a data eye indicating performance characteristics of a memory system.

2. Background Art

As they continue to increase input/output (I/O) data rates, successive generations of memory technologies such as dual data rate (DDR) random access memory (RAM) are increasingly sensitive to the effects of phase difference between signals transmitted on different signal lines. For example, memory system performance may depend on an acceptable phase difference between a data signal DQ and an associated data strobe signal DQS which indicates, for example, a time for the data signal DQ to be read (or not read).

The susceptibility of a memory system to the effects of such signal phase difference may depend on one or more additional parameters of an operating state under which I/O is performed. Evaluation of a memory system's performance under various operating states often includes analysis of a "data eye"—e.g. an area in a graph of operating parameters—in which performance of the memory system in question is considered to be sufficiently reliable.

Techniques for measuring data eye characteristics for a particular memory system have, to date, been limited to various rectilinear approaches—e.g. "eye height" and/or "eye width". For example, in the case of a data eye in a 2-dimensional plane for two operating parameters, data eye measurements have typically relied upon setting a particular "horizontal" (e.g. phase) value of a first operating parameter, and taking a set of measurements along a range of "vertical" (e.g. voltage) values of the second operating parameter. This measuring of a set of "vertical" values is typically repeated, each set of measurements for a different respective "horizontal" value of the second operating parameter. It is appreciated that these previous practices may use measuring techniques wherein these vertical and horizontal axes are switched.

In addition, analyzing these rectilinear measurements to evaluate a particular operating point of the memory system has typically been limited to evaluating for that operating point an associated "height" of the data eye as measured only in the direction of one of the two operating parameters and/or evaluating for that operating point an associated "width" of the data eye as measured only in the direction of the other one of the two operating parameters. However, reliance on such rectilinear measurement and/or analysis is prone to inefficiency and/or sub-optimal results. For example, an asymmetric or otherwise irregular shape of a data eye may cause regions thereof to escape recognition by measurements which are made only along such horizontal (or vertical) measuring dimensions. Moreover, these irregular data eye features may be inaccurately represented if the data eye is analyzed only in terms of rectilinear squares (or rectangles) having edges parallel to the axes for the operating parameters.

The limitations of using rectilinear measurement techniques may be mitigated by further applying more sophisticated data analysis techniques to the measurement information. However, such analysis techniques require storing all of the rectilinear measurement information for a data eye at one time and then processing the information as a whole. This increases the storage, computational and/or processing time requirements for completing data eye analysis of a memory system's performance characteristics.

BRIEF DESCRIPTION OF THE DRAWINGS

The various embodiments of the present invention are illustrated by way of example, and not by way of limitation, in the figures of the accompanying drawings and in which.

DETAILED DESCRIPTION

For memory systems, particularly those using single ended interfaces such as DDR, phase difference between signals may be a significant limiter for both frequency and reliability of an I/O link. As described herein, various embodiments provide techniques to evaluate memory system performance based on relative phase between two signals. For example, in various embodiments, memory system performance may be tested according to a relative phase difference between a data signal and its associated data strobe signal. Additionally or alternatively, memory system performance may be tested according to a relative phase difference between the data signal and one or more "aggressor" signals which are the source of crosstalk, where the data signal is a "victim" signal which is subject to such crosstalk. Such evaluation may generate information which is referenced in order to adjust operation of the memory system—e.g. for improving I/O performance without requiring additional power, area, cost, etc.

Various embodiments include testing—e.g. as a training algorithm—which may be implemented in some combination of hardware means and/or software means. More particularly, various embodiments include a method where a 2-dimensional "sample eye" is defined by sample points of a test round, the sample points characterized along multiple different axes—e.g. 60°, 90° and 120°—at least two of which are oblique to one another. By using an oblique axis method and limiting the margin to whichever of the points fails first (or some other mathematical combination of the points such as average, etc.), the relative phase difference of signals may be adjusted to provide optimal margin for a given data eye shape. Although particular features are described herein in terms of single-ended and/or DDR exchanges of a memory system interface, such features may be extended to apply to any interface where one can control the relative phases between the victim and aggressor signals.

Figure 1:
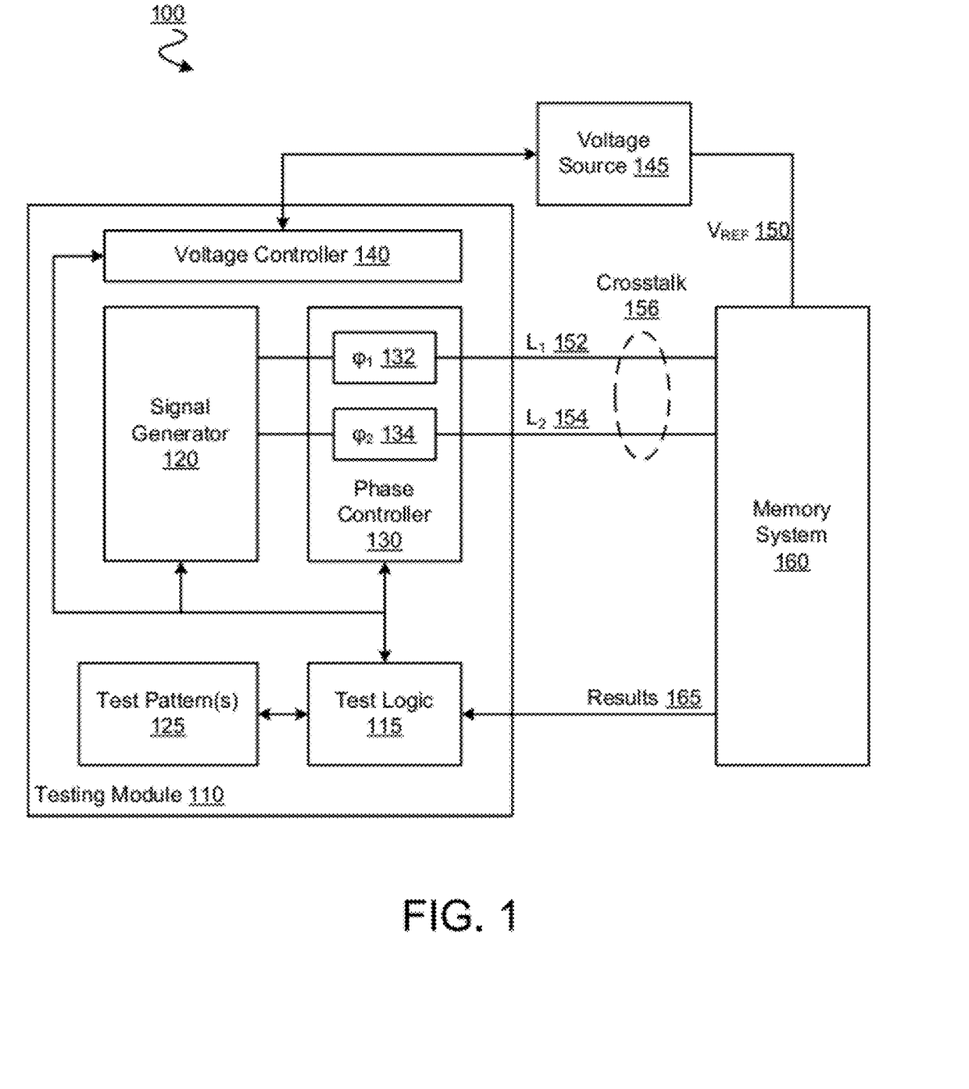
FIG. 1 is a block diagram illustrating select elements of a system to test effects of signal phase difference according to an embodiment.

FIG. 1 illustrates select elements of a system 100 including a testing module 110 to test the effects of signal phase difference according to an embodiment. By way of illustration and not limitation, testing module 110 may include one or more means for testing whether and/or how a relative phase difference between a data signal and some other signal might mitigate the effects of crosstalk in the data signal. Alternatively or in addition, testing module 110 may include one or more means for testing whether and/or how a relative phase difference between a data signal and it associated data strobe signal might contribute to effective reading (e.g. latching) of the data signal.

Features of various embodiments which relate to evaluating crosstalk are described below with respect to FIG. 1. In an exemplary embodiment, testing module 110 may include one or more means for testing the effects of crosstalk 156 between a first line $L_1$ 152 exchanging a first signal for a memory system 160—e.g. a DDR or other memory device—and a second line $L_2$ 154 exchanging a second signal for memory system 160. Such crosstalk testing may include testing module 110 implementing operations to generate test data and/or evaluating such test data according to one or more criteria. It should be understood that victim or aggressor signal is used in a generic sense here and could represent one or more signals that all share a common phase relationship. For example, in a DDR memory subsystem, each of the lines $L_1$ 152 and $L_2$ 154 could represent a single data lane, a source synchronous data group or an entire channel. Where the respective individual line or lines represented by each of $L_1$ 152 and $L_2$ 154 share a common, adjustable phase relationship, the crosstalk evaluation (and optimization) technique described herein may be applied.

Use of the terms "victim" and "aggressor" herein refers to the fact that detection of a given (victim) signal in a first (victim) line may be prone to error due to crosstalk from a second (aggressor) line carrying another (aggressor) signal. It is understood that said first line may also be a source of crosstalk in the second line. Therefore, evaluation of crosstalk may additionally be performed in which the first and second lines have switched their respective roles as victim line and aggressor line.

Testing module 110 may include any of a variety of combinations of hardware and software means to perform a crosstalk test algorithm and/or to evaluate test data resulting from such an algorithm. For example, various elements of testing module 110 may each include one or more of an application specific integrated circuit (ASIC), field-programmable gate array (FPGA), state machine, computer code and/or similar means which are configured to perform crosstalk testing as described herein.

In an embodiment, testing module 110 may include test logic 115. Testing module 110 may also include one or more of a signal generator 120, a phase controller 130 and a voltage controller 140, each to operate according to the test logic 115. Test logic 115 may include hardware and/or software means to represent, perform and/or communicate crosstalk testing. More particularly, test logic 115 may communicate to various ones of the signal generator 120, phase controller 130 and voltage controller 140 operations to be performed to implement a crosstalk test algorithm for generating test data. Alternatively or in addition, test logic 115 may include logic to evaluate test data generated from such test algorithm.

Signal generator 120 may include hardware and/or software means to operate according to a test algorithm of test logic 115 to generate a victim signal in victim line $L_1$ 152 and/or an aggressor signal in aggressor line $L_2$ 154. Such operation of may include signal generator 120 providing to victim line $L_1$ 152 and/or aggressor line $L_2$ 154 respective data of test pattern(s) 125 at a particular time. Phase controller 130 may include hardware and/or software means to operate according to the test algorithm of test logic 115 to assure that a phase $\phi_1$ 132 of the victim signal has a particular value at a particular time. This operation by phase controller 130 may further include assuring that a phase $\phi_2$ 134 of the aggressor signal has a particular value at the particular time. Voltage controller 140 may include hardware and/or software means to operate according to the test algorithm of test logic 115 to assure that a voltage source 145 provides to memory system 160 a reference voltage $V_{REF}$ 150 that has a particular value at the particular time.

Based on the test algorithm of test logic 115, an exchange of data by memory system 160 via $L_1$ 152 may result in generation of some test results 165. These test results may then be provided—for example from memory system 160 to test logic 115—and be evaluated according to one or more test criteria. Evaluation of the criteria may include determining whether (or not) a level of crosstalk 156 causes memory system 160 to operate at or below some acceptable performance level, such as detecting an exceeding of some error or bit error rate threshold. Additionally or alternatively, evaluation of such test results may include determining a preferred operating state for exchanging data by memory system 160.

In various embodiments, certain features of system 100—discussed above in relation to evaluating crosstalk—may be extended to additionally or alternatively apply to evaluating data strobing. Features of various embodiments which relate to evaluating data strobing are described below with respect to FIG. 1. According to one such embodiment, $L_1$ 152 may instead represent a first line to carry a data signal to memory system 160, and $L_2$ 154 may instead represent a second line to carry a data strobe signal associated with the data signal of $L_1$ 152. Phase controller 130 may operate according to a test algorithm of test logic 115 to assure a particular phase difference between a phase $\phi_1$ 132 of the data signal and a phase $\phi_2$ 134 of the associated data strobe signal. Voltage controller 140 may further operate according to the test algorithm of test logic 115 to assure that a voltage source 145 provides to memory system 160 a reference voltage $V_{REF}$ 150 that has a particular value at a particular time.

Based on the test algorithm of test logic 115, an exchange of data by memory system 160 via $L_1$ 152 may result in generation of some test results 165. These test results may then be provided—for example from memory system 160 to test logic 115—and be evaluated according to one or more test criteria. Evaluation of the criteria may include determining whether (or not) a level of performance of memory system 160 indicates incorrect data strobing to latch data being read by memory system 160 from $L_1$ 152. Additionally or alternatively, evaluation of such test results may include determining a preferred operating state for exchanging data by memory system 160.

Figure 2:
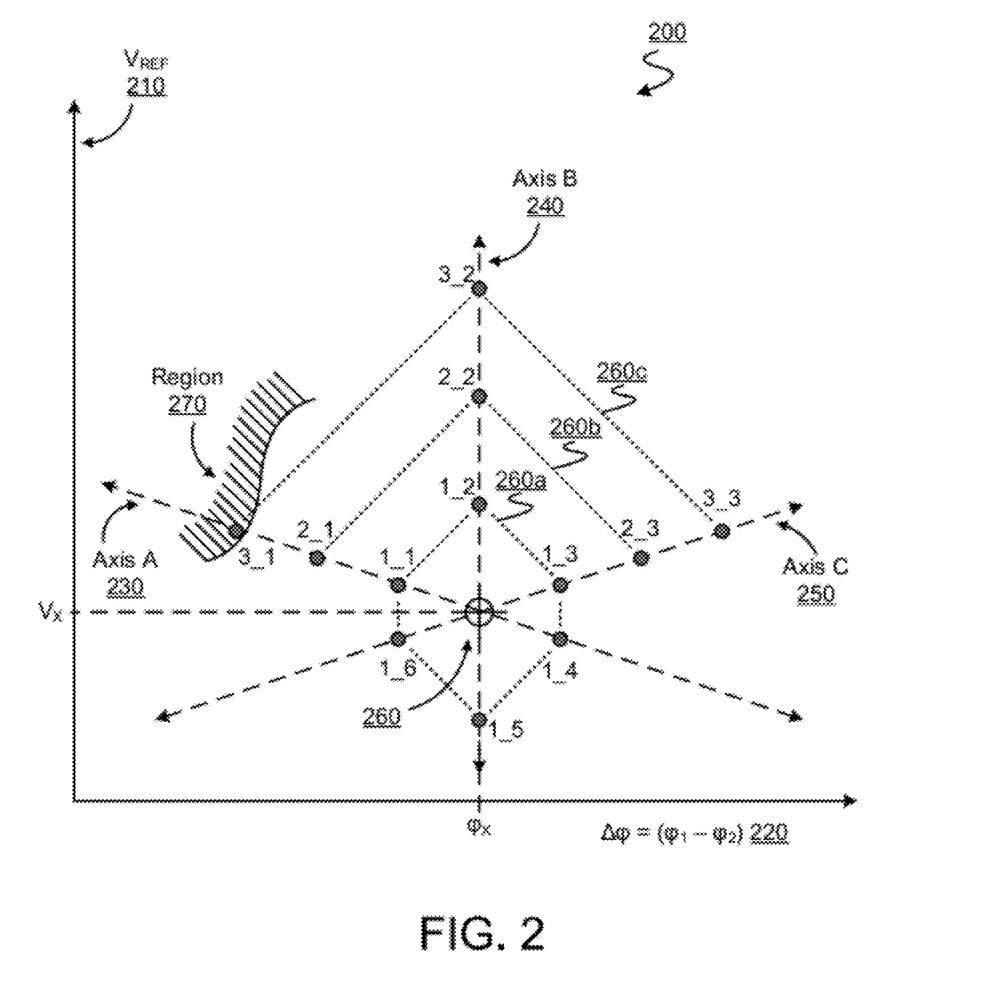
FIG. 2 is a graph illustrating a set of operating characteristics for which effects of signal phase difference may be tested according to an embodiment.

FIG. 2 illustrates select elements of a graph 200 describing a set of operating characteristics according to which effects of signal phase difference may be tested in various embodiments. Graph 200 may, for example, represent certain operating conditions for operation memory system 160. Graph 200 includes a $V_{REF}$ axis 210 and a phase difference axis $\Delta\phi$ 220. $V_{REF}$ axis 210 may represent a range of values for $V_{REF}$ 150, for example. In various embodiments, phase difference axis $\Delta\phi$ 220 may represent a range of values for a difference between a phase of a data signal and a phase of its associated data strobe signal. In various alternate embodiments, phase difference axis Δϕ 220 may represent a range of values for a difference between a phase of a victim signal and a phase of an aggressor signal which may be a source of crosstalk for said victim signal.

In an embodiment, effects of signal phase difference may be evaluated by a test algorithm having one or more rounds of testing, where a given test round includes sequentially testing a memory system under different operating states corresponding to different respective points on the graph 200. The points on graph 200 which correspond to a particular round of testing—referred to herein as sample points for a round—may be described with respect to a reference point of graph 200 associated with the round, e.g. point 260. Reference point 260 may represent an operating state in which voltage $V_{REF}$ has a value $V_X$ and phase difference Δϕ has a value $ϕ_X$. For the sake of brevity, graph 200 only shows an exemplary set of sample points of a single test round. It is understood that testing according to techniques discussed herein may include one or more additional or alternative test rounds, each such test round including additional and/or alternative sample points.

By way of illustration and not limitation, in a memory system such as a DDR3 memory system, $V_{REF}$ level may be nominally set to half the supply voltage (Vdd/2) and may be used as a reference to distinguish whether a data signal represents logical "one" or a logical "zero". In the sequential testing for sample points of a given test round, this $V_{REF}$ level may be variously adjusted higher or lower to vary sample point locations along the "eye height" dimension (as oriented in graph 200). Additionally or alternatively, the sequential testing for these sample points of the same given test round may include variously adjusting higher or lower values for the phase difference Δϕ to vary sample point locations along the "eye width" dimension (as oriented in graph 200).

In an embodiment where the phase difference Δϕ represents a relative phase between a DQ data lane and it's associate DQS strobe, DQS may nominally be ninety degrees (90°) out of phase with DQ to sample data in the middle of the data eye. The phase difference between DQ and DQS may be variously adjusted. By varying both the voltage and phase axis together for sequential sample points of a single test round—and optionally by performing multiple similar test rounds—one can trace an entire 2-D data eye shape.

In an embodiment, a round of testing may include two or more sample points of graph 200, each of which is offset from the reference point for the round along a different respective one of multiple axes in the plane formed by $V_{REF}$ axis 210 and Δϕ axis 220, where the multiple axes include at least two axes which are oblique to one another in the plane. By way of illustration and not limitation, a first round 260a may include sequentially testing operation of memory system 160 at sample points 1_1, 1_2 and 1_3 which are offset from reference point 260 by axis A 230, axis B 240 and axis C 250, respectively. In an embodiment, 260a may further include testing for other points which are each offset along one of axis A 230, axis B 240 and axis C 250—e.g. sample points 1_4, 1_5 and 1_6. Two sample points for a round of testing may be offset from reference point 260 along axes which are oblique (not orthogonal) to one another. It is understood that any of a variety of additional or alternate combinations of two or more axes and corresponding sample points may be associated with round of testing 260a. One or more reference points for $V_{REF}$ or Δϕ may be assumed to be previously determined by either statically setting the values at some "ideal" setting ($V_{REF}$=Vdd/2 and Δϕ=90 degrees) or through some form of training Methods to achieve these initial settings will be apparent to one skilled in the art without these specific details.

The number of axes (ex: A 230, B 240 and C 250) and their respective slopes may be determined by the possible eye shapes for the system under test. For example, axis B 240 may be used to eliminate ringback in the middle of a data eye. The slopes and relative heights of the different axes may be determined based on a desired eye shape and used to tradeoff different performance metrics (ex: eye height vs eye width) to optimize the overall system reliability.

In an embodiment, a stage of testing may include one or more rounds of testing, e.g. including first round 260a. Multiple test rounds of a testing stage may, for example, all be associated with a common reference point—e.g. reference point 260. By way of illustration and not limitation, a testing stage may include successively performing rounds of testing—e.g. first round 260a, second round 260b and third round 260c—where each successive round includes successively testing a respective set of sample points. In addition to the sample points of first round 260a, the testing stage associated with reference point 260 may include second round 260b for sample points 2_1, 2_2 and 2_3 and/or third round 260c for sample points 3_1, 3_2 and 3_3. Sample points used in one test round may, for example, be used to determine one or more sample points to be used in another test round—e.g. by applying a scale factor. For example, the respective offsets of sample points 1_1, 1_2 and 1_3 from reference point 260 along their respective axes A, B and C may be variously scaled to determine sample points to be used in either or both of second round 260b and third round 260c.

For each sample point in a round, a victim signal and an aggressor signal may be provided, respectively, in a victim line and an aggressor line. A memory system may include a receiver to detect the victim signal. Detection of the victim signal by the memory system may result in one or more data read errors, depending on the current operating state—e.g. including the current $V_{REF}$ value and the current Δϕ value. A data read error may include, for example, a misread of a data value and/or an unacceptable delay in reading a data value. Testing may include evaluating for a particular test round whether any threshold level of a data read error was exceeded in detecting a victim signal at any of the sample points of the test round.

In a given test stage, successive test rounds of the test stage may include sample points which are increasingly offset from reference point 260. In such embodiments, sample points of successive test rounds of a test stage may cover increasingly large areas of graph 200. For a given test stage, a result of a former test round of the test stage may determine whether the test stage is to further include any subsequent test round. For example, at some point, an area of one such test round may extend into a region—e.g. region 270—in which a threshold level of a data read error is exceeded for victim signal detection of that test round. Based on the test rounds of the test stage, test result information may be generated for the test stage. Such test result information may include data describing a location of reference point 260 in region 200 and/or an offset of region 270 from reference point 260. Additionally or alternatively, such test result information may include a mathematical combination of the where the A, B and C sample points in the ($V_{REF}$, Δϕ) plane cross into region 270.

In an embodiment where the phase difference Δϕ represents a relative phase between a victim signal and an aggressor signal, sequential testing of sample points for a given test round may include variously adjusting higher or lower values for the phase difference Δϕ to vary the sample point locations along the "eye width" dimension (as oriented in graph 200). By varying both the voltage $V_{REF}$ and phase axis together for sequential sample points of a single test round—and optionally by performing multiple similar test rounds—one can trace an entire 2-D data eye shape.

Figure 3:
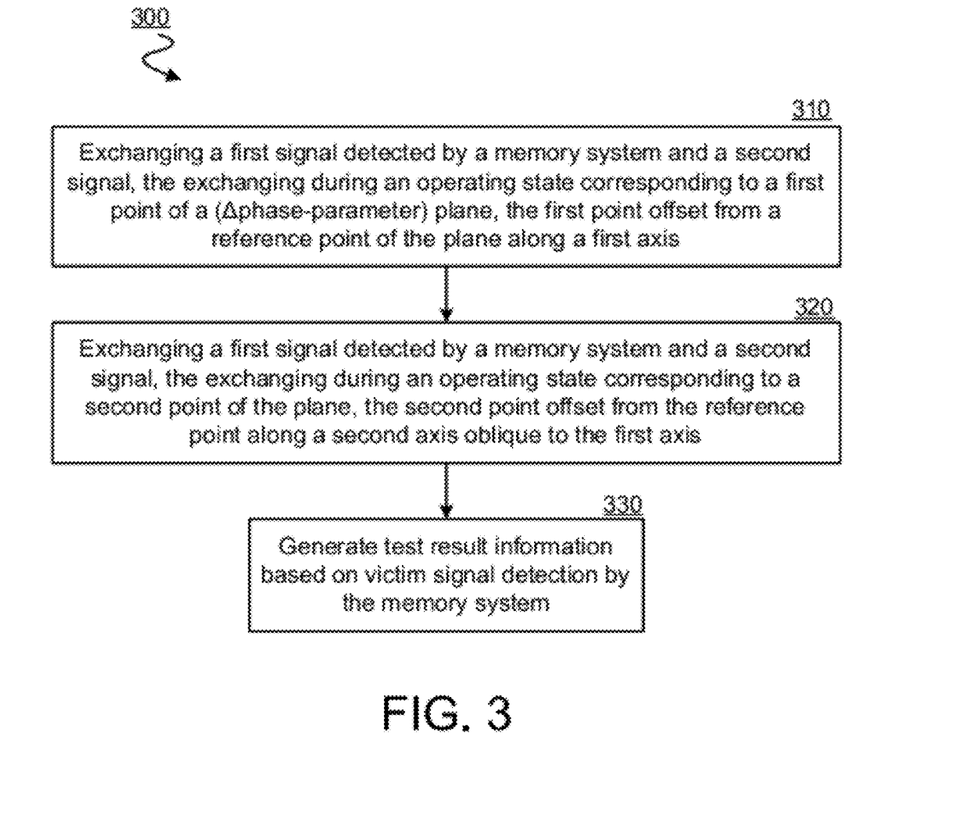
FIG. 3 is a flow diagram illustrating select elements of a method to test effects of signal phase difference according to an embodiment.

FIG. 3 illustrates select elements of a method 300 according to an embodiment to test effects of signal phase difference for data exchanges of a memory system. Operations of method 300 may include, for example, operations performed by testing module 110. The method 300 may include, at 310, a first exchange of signals in which a first signal and a second signal are exchanged, where at least the first signal is detected by a memory system. An operating state for the exchanging the first signal may be characterized by two or more parameters. By way of illustration and not limitation, the two or more parameters may include at least some combination of a $V_{REF}$ voltage provided to the memory system, a relative phase difference between a data signal and its associated data strobe signal, and a relative phase difference between a victim signal and an aggressor signal being evaluated as a potential source of crosstalk for said victim signal.

The operating state may correspond to a point of a plane defined by two axes, each of which represents a range of possible values for a corresponding one of the two or more operating state parameters. For example, the operating state may represent a point in an N-dimensional metric space which includes the plane, the metric space defined by N axes, each axis representing a range of possible values for a corresponding one of N parameters. In an embodiment, at least one of the two axes defining the plane is a signal phase difference parameter ($\Delta\phi$). Such a plane is referred to herein as a $\Delta$phase-parameter plane. The operating state for the exchanging the first signal of the first exchange may correspond to a first point on the above-described $\Delta$phase-parameter plane. This first point may be offset from some reference point of the $\Delta$phase-parameter plane along a first axis.

Method 300 may further include a second exchange of signals in which another first signal and second signal are exchanged, where at least the first signal is detected by a memory system. The first signal and/or the second signal of the first exchange of signals may be the same as (or different from) first and/or second signals of other exchanges of signals, according to various embodiments. An operating state for the exchanging the first signal of the second exchange may correspond to a second point on the $\Delta$phase-parameter plane. This second point may be offset from the reference point of the $\Delta$phase-parameter plane along a second axis other than the first axis. In an embodiment, the second axis is not orthogonal to the first axis in the $\Delta$phase-parameter plane. For example, one of the first axis and the second axis may represent a combination of multiple operating state parameters, where the other of the first axis and second axis represents either only a single operating state parameter, or a different combination of multiple operating state parameters.

Although features of various embodiments are described herein in terms of test rounds in which sample points are offset variously on three axes of a $\Delta$phase-parameter plane, it is understood that the principles described may be extended to a test round in which sample points are offset along respective ones of two (or more) axes, where at least a first axes and a second axes are oblique (non-orthogonal) to one another.

Subsequent to the first and second exchanges, method 300 may include generating test result information, at 340, based on the memory system's detection of the various victim signals which were exchanged. The test result information may include data which is stored by the memory system as a result of such detecting. Alternatively or in addition, the test result information may include data describing whether such data which is stored by the memory system accurately reflects corresponding data as it was transmitted in the victim signal.

Alternatively or in addition, the test result information may include data describing whether any threshold level of a data read error was exceeded—e.g. by an unacceptably large read delay and/or by a failure of such data which is stored by the memory system to accurately reflect corresponding data as it was transmitted in the victim signal. Alternatively or in addition, the test result information may include information indicating a location of the reference point in the $\Delta$phase-parameter plane and/or an offset from such reference point of a sample point at which a threshold level of a data read error was exceeded.

Figure 4:
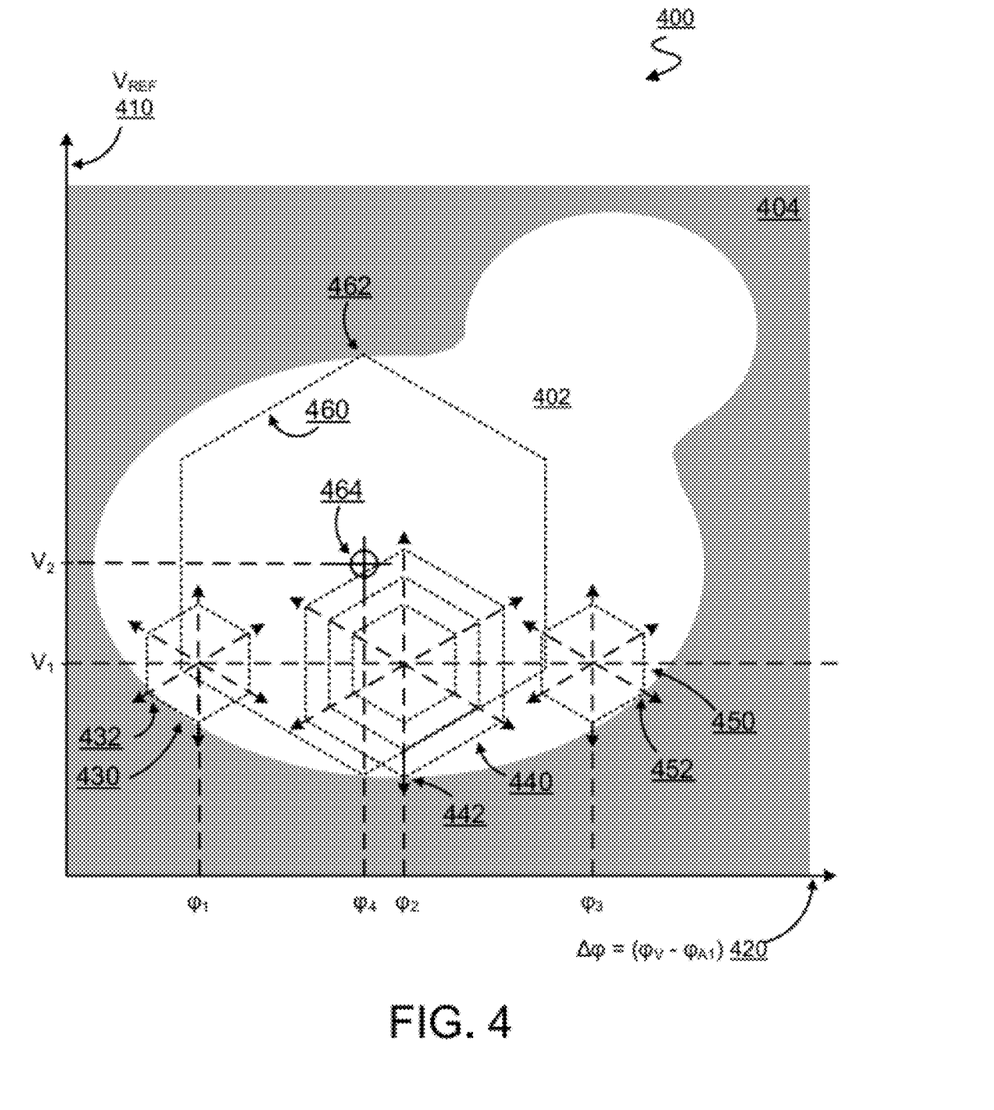
FIG. 4 is a graph illustrating a set of operating characteristics for which effects of signal phase difference may be tested according to an embodiment.

FIG. 4 illustrates select elements of a graph 400 describing a set of operating characteristics according to which effects of signal phase difference may be tested in an embodiment. The set of operating characteristics described by graph 400 may include some or all of the set of operating characteristics described with respect to graph 200, for example. Graph 400 includes a $V_{REF}$ axis 410 and a phase difference axis $\Delta\phi$ 420. $V_{REF}$ axis 410 may represent a range of values for $V_{REF}$ 150, for example, and phase difference axis $\Delta\phi$ 420 may represent a range of values for a difference between signal phase $\phi_1$ 132 and signal phase $\phi_2$ 134—e.g. where testing is to evaluate whether/how an exchanging of a signal having signal phase $\phi_1$ 132 might be affected by a signal having signal phase $\phi_2$ 134.

It is understood that the plane represented by graph 400 may be part of a larger N-dimensional space (not shown) defined by N axes, each representing a respective range of values for a corresponding one of N parameters of an operating state. By way of illustration and not limitation, the N parameters may include one or more relative phase differences $\{(\phi_V-\phi_{A1}), (\phi_V-\phi_{A2}), \ldots\}$ between the same victim signal and different respective aggressor signals. Additionally or alternatively, the N parameters may include a phase difference between the victim signal and an associated data strobe signal. Data strobe evaluation may be conducted in addition to—e.g. independent of or in combination with—crosstalk evaluation.

Graph 400 also includes an area 402 representing operating characteristics for which a memory system can operate below some threshold level of a data read error—e.g. by being sufficiently accurate in detecting data in a victim signal as it was transmitted in a signal line. Such an area 402 may be referred to as a "data eye". For example, area 402 may represent operating characteristics for which there is an acceptably low level of crosstalk in the victim signal for the memory system to reliably exchange information via the victim signal. Furthermore, graph 400 includes an area 404 representing operating characteristics for which the memory system exceeds some threshold level of a data read error—e.g. by incorrectly interpreting a victim signal transmitted to represent some data value as representing some other data value. For example, area 404 may represent operating characteristics for which crosstalk in the victim signal is too great for the memory system to reliably exchange information via the victim signal. It is understood that this "binary" distinction between passing area 402 and failing area 404 may be further refined into an arbitrary number of intermediary regions (not shown) representing incremental levels of reliability for operation of the memory system.

In an embodiment, testing crosstalk may include testing a memory system under various operating conditions, each corresponding to different points on graph 400. For example, testing crosstalk may include various testing rounds, each associated with a respective reference point of graph 400. A given testing round may include, for example, some or all of the operations of method 300. Moreover, one or more testing rounds may be included in a single testing stage—such as described above in the discussion of FIG. 2—wherein each of the one or more testing rounds of the testing stage are associated with the same reference point.

By way of illustration and not limitation, testing crosstalk according to one embodiment may include test stage 430 for a reference point at ($\phi_1$, $V_1$), test stage 440 for a reference point at ($\phi_2$, $V_1$), and test stage 450 for a reference point at ($\phi_3$, $V_1$). Although other test stages are not shown for clarity in illustrating certain features of an embodiment, the crosstalk testing may include any of a variety of additional or alternative test stages, e.g. test stages associated with different respective reference points in an N-dimensional crosstalk space.

A given test stage may include successive test rounds, each test round having two or more sample points. The sample points of a given test round may include two sample points which are each offset from a reference point in the ($\Delta\phi$, $V_{REF}$) plane. Successive test rounds of a test stage may include testing for sample points which are increasingly offset from the reference point along their respective axes. For example, the offset of sample points from a reference point may be increasingly scaled—e.g. by a scale factor—until a testing of the memory system for one of the sample points results in a test failure as described in FIG. 2. Such a test failure may include, for example, a threshold level of a data read error being exceeded by the memory system. Such a failure may indicate that the sample point in question is in area 404 rather than area 402.

By way of illustration and not limitation, successive test rounds in each of test stages 430, 440 and 450 may identify test failures at points 432, 442 and 452, respectively. For a given test failure of a test stage, the ($\Delta\phi$, $V_{REF}$) offset of a sample point from the associated reference point may indicate a level of confidence in operating the memory system according to an operating state which corresponds to the reference point for the test stage. Therefore, the reference point for test stage 440 may be a more reliable operating point for the memory system than a reference point for either test stage 430 or test stage 450.

After performing multiple test stages for multiple reference points in the ($\Delta\phi$, $V_{REF}$) space, a test round for one such reference point may be identified as having a sample point with the largest ($\Delta\phi$, $V_{REF}$) offset from its associated reference point before a test failure was detected. For example, a test round 442 associated with a reference point 440 may result in a test failure for a point 462, where no other corresponding offset of the multiple test stages is larger than the offset of point 462 from its respective reference point 440.

Select features of one embodiment are illustrated below as pseudo code for a measurement algorithm testing crosstalk for only two signals, victim and aggressor. The algorithm searches through different relative phase difference values, looking for the phase difference value that provides the best voltage and timing margin.

```
BestPhase = BestHeight = 0
# relPhase is the phase between the attacker and victim signal
for (relPhase = minValue; relPhase < maxValue; relPhase = relPhase+step)
    ApplyPhase(relPhase)
    # Find the Eye Height at the current phase
    # Find both high and low side margin
    EyeHeight = 0
    for (sign = -1; sign < 2; sign = sign+2)
        # Search through different V_REF settings until a failure is found
        for (vref = 0; vref <= MaxVref; vref+1)
            # Do 3 point measurement, running test at each point
            # Constant A sets the slope of the phase/voltage axes
            # Constant B sets the shape of the top of the eye
            # Function RunIOTest runs a test and returns if it fails
            ApplySampleOffset (vref = sign*vref, time = -A*vref)
            Fail = RunIOTest
            ApplySampleOffset (vref = sign*B*vref, time = 0)
            Fail = Fail or RunIOTest
            ApplySampleOffset (vref = sign*vref, time = A*vref)
            Fail = Fail or RunIOTest
            If Fail:
                EyeHeight = EyeHeight + vref
                Break
            If vref == MaxVref
                EyeHeight = EyeHeight + vref
    # Is this point better
    if EyeHeight > BestHeight:
        BestHeight = EyeHeight
        BestPhase = relPhase
ApplyPhase(BestPhase)
ApplyEyeSampleOffset (vref=0, time=0)
```

The training flow described in the pseudo code above uses a 3-point sample eye measurement technique that fits a test round sample eye to a hexagon shape—e.g. as shown in FIG. 4. Most previous approaches to characterizing crosstalk have generally focused on only rectilinear measuring along eye height and/or along eye width. Measuring only along these two axes is very limiting in that it does fully capture the effect of data strobe phase and/or crosstalk, or recognize that one or more different sample eye shapes can fit into the same height/width measurements. The exact sample eye shape to be used—e.g. based on the number of offset axes used and their respective slopes—may be important. For example, non-oval sample eye shapes may be comparatively more sensitive to a particular data pattern and/or test dwell time, improving the correlation between training and real-world margin results.

In one embodiment, the above algorithm may be extended to include additional FOR relPhase loops to further evaluate the effects of crosstalk between more than two signals in some $\{\phi_1, \ldots \phi_N\}$ space. Such an extension of the above algorithm may include one additional FOR loop for each additional signal (or signal group). The number of sample points can quickly grow to a very large number in terms of the effect on runtime requirements. However, there are many existing N-dimensional search algorithms that can be applied to reduce the number of points that need to be sampled. Examples of such algorithms include steepest descent, simulated annealing/diffusion and genetic searches. Many of these algorithms use a variety of curve fitting techniques to minimize the number of points in $\{\phi_1, \phi_2, \ldots \phi_N\}$ space that need to be tested in order find a global maximum.

The slope of an offset axis defining a sample eye shape, which may be dependent on the memory interface being evaluated, may be optimized to give the best result. In the above pseudo-code, one axis slope is generically represented by the slope value A. The geometric shape of a sample eye defined by sample points of a test round—and/or the number of points/axes to be used in a test round—may be adjusted to achieve, for example, a desired a tradeoff between test runtime vs. accuracy. For example, if ringback on an I/0 bus is not problematic, it may be possible to drop from a test round sample points which are offset from a reference point along the direction of the $V_{REF}$ axis. Similarly, if it is possible to induce high frequency glitches, then additional axes may be required. The slope value A may be adjusted to tradeoff the relative importance of timing vs. voltage in the overall system reliability.

Figure 5:
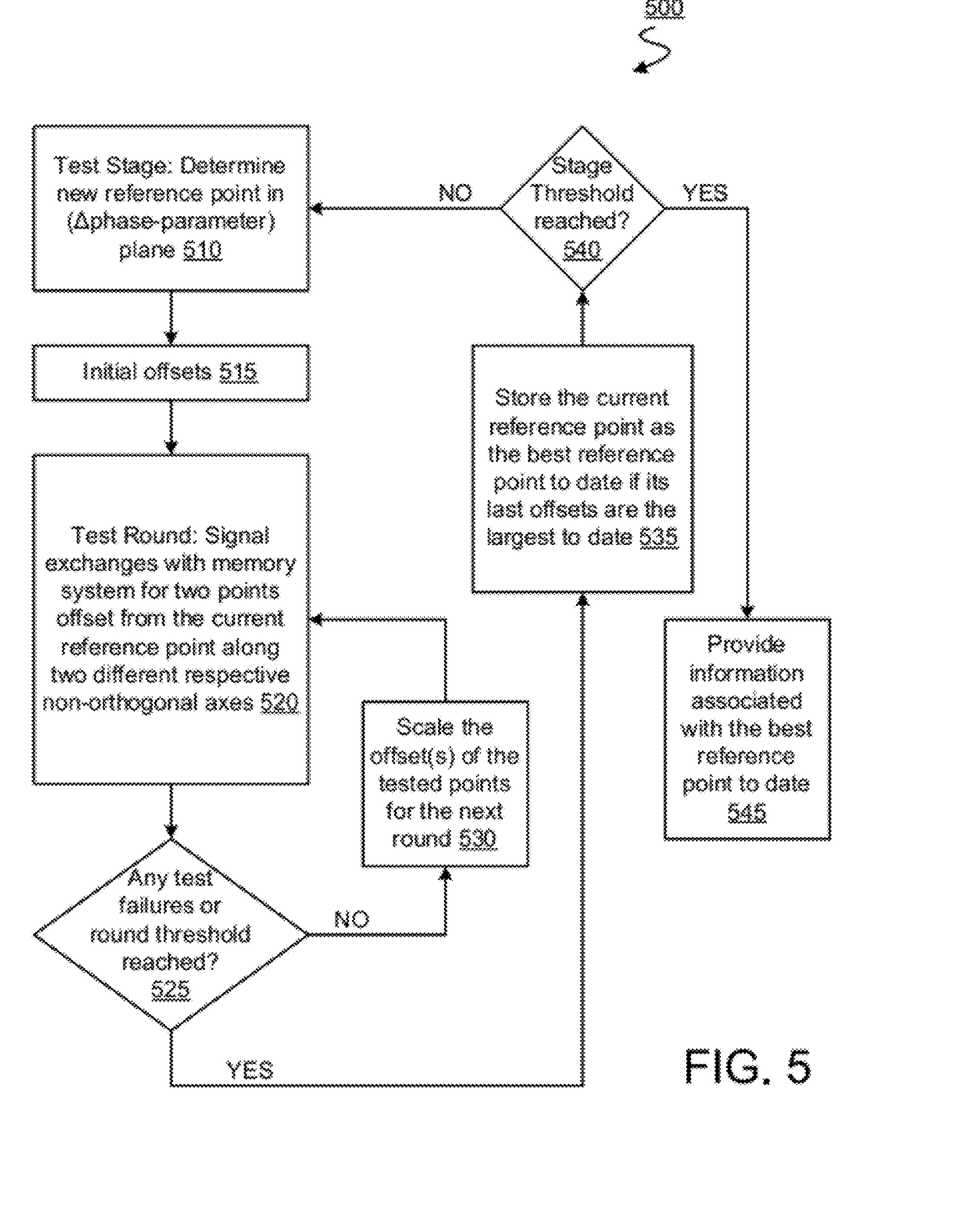
FIG. 5 is a flow diagram illustrating select elements of a method to test effects of signal phase difference according to an embodiment.

FIG. 5 illustrates select elements of a method 500 for testing effects of signal phase difference according to an embodiment. Operations of method 500 may include operations performed by system 100, for example. Method 500 may include one or more test stages, each including one or more test rounds to evaluate performance of a memory system under various operating conditions. A test round of method 500 may include one or more features of a test round as discussed herein with respect to FIG. 2. Additionally or alternatively, a test stage of method 500 may include one or more features of a test stage as discussed herein with respect to FIG. 4.

In an embodiment, method 500 may include, at block 510, determining for a new (e.g. first) test stage a reference point a Δphase-parameter plane—e.g. a Δphase-parameter plane which is included in and/or intersects a $\{\phi_1, \phi_2, \ldots \phi_N\}$ space. The Δphase-parameter plane may, for example, include the plane similar to the one represented in either of graphs 200 and 400. Initial offsets are identified, at block 515, for a first test round of the current test stage.

A current test round of the current test stage may be performed, at block 520. In an embodiment, the test round may include the operations of method 300. The test round may include two or more signal exchanges, each to exchange in a respective operating state for the memory system respective first and second signals. The signal exchanges of the test round may include exchanges in two different operating states for the memory system, where the two operating states each correspond to different sample points in the Δphase-parameter plane, and where each of the two sample points is offset from the reference point for the current test stage along a different respective one of two axes which are oblique (non-orthogonal) to one another in the Δphase-parameter plane.

A determination is made, at block 525, as to whether any signal exchanges of the completed test round resulted in a data read error or other relevant test failure. If not, then the previous reference point-to-sample point offsets are scaled, at block 530, for sample points of the next test round. A next test round for the current test stage may then be performed according to the scaled offsets, at block 520. The successive performing of test rounds with successively scaled offsets may be performed until a test failure is detected or, in various embodiments, until some threshold value for the test round has been reached. In an embodiment, a test round threshold may include a maximum voltage offset value and/or a maximum phase difference offset value.

If it is determined, at block 525, that some signal exchange of the latest test round did result in a test failure, the current test stage is complete. Data may be stored which indicates that the reference point of the latest test round is the best reference point to date, the storing conditioned upon the reference point-to-sample point offsets of the latest test round being at least as large as corresponding offsets of any test failure of a previous test round. A determination is made, at block 540, as to whether any stage threshold has been reached, indicating that the previous test stage is the last test stage. In an embodiment, a stage threshold may include, for example, a maximum voltage value for a test stage reference point and/or a maximum phase difference offset value for a test stage reference point. If no test stage threshold has been reached, then a next test stage may be initiated, at block 510. Otherwise, at block 545, method 500 provides information associated with the best reference point of all test rounds performed. In an embodiment, the best reference point may be the most recent reference point for which information was stored in response to meeting the conditions of block 535.

Figure 6A:
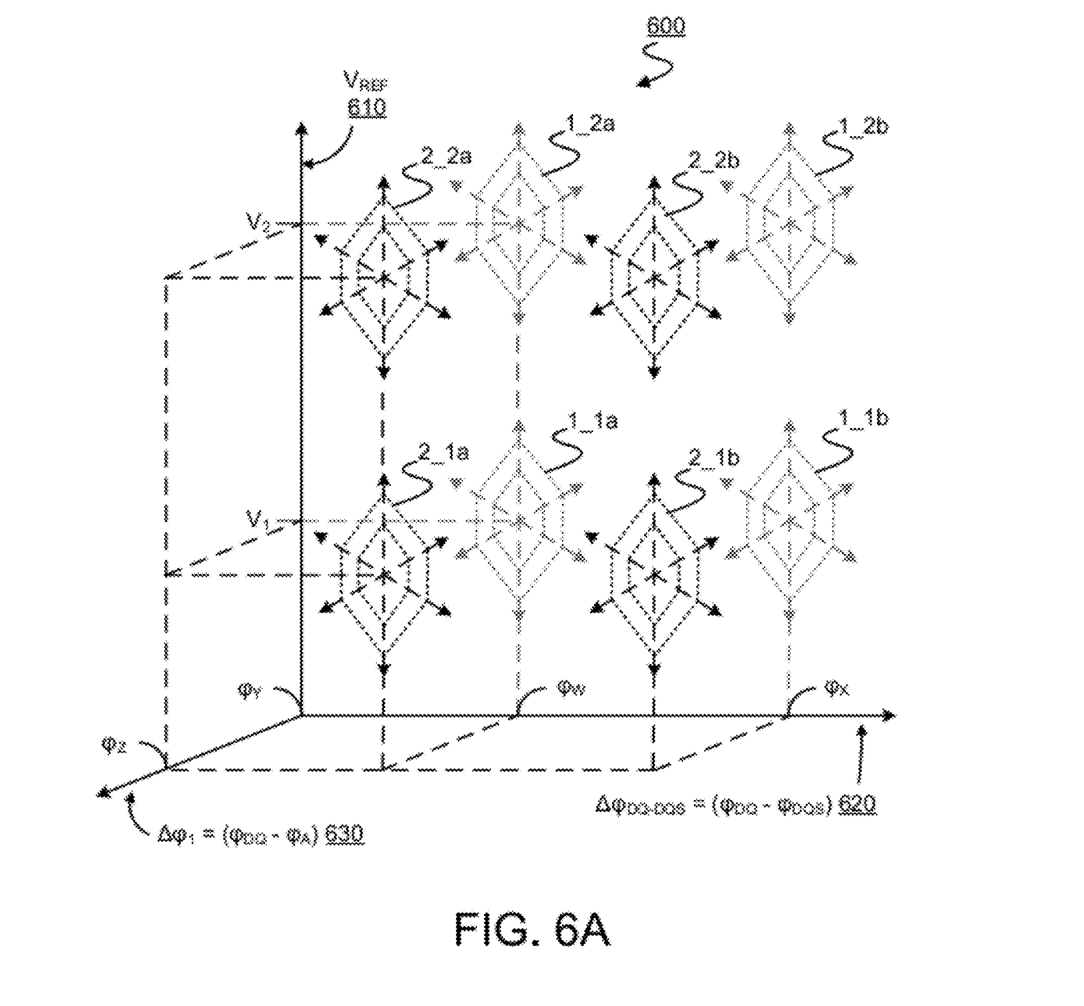
FIG. 6A is a graph illustrating a set of operating characteristics for which effects of signal phase difference may be tested according to an embodiment.

FIG. 6A illustrates select elements of a graph 600 of a set of operating characteristics according to which signal phase difference may be tested in an embodiment. Crosstalk testing techniques illustrated in graph 600 may extend principles described herein with respect to graph 400 and/or method 500, for example.

Graph 600 includes a $V_{REF}$ axis 610, a first phase difference axis $\Delta\phi_{DQ\text{-}DQS}$ 620 and a second phase difference axis $\Delta\phi_1$ 630. The phase difference axis $\Delta\phi_{DQ\text{-}DQS}$ 620 may represent a range of values for a difference $\Delta\phi_{DQ\text{-}DQS}$ between a phase $\phi_{DQ}$ of a data signal and a phase $\phi_{DQS}$ of a data strobe signal associated with a reading/latching of the data signal. The phase difference axis $\Delta\phi_1$ 630 may represent a range of values for a difference $\Delta\phi_1$ between the phase $\phi_{DQ}$ of the data signal and a phase $\phi_A$ of an aggressor signal which may be a source of crosstalk for said data signal. Testing effects of signal phase difference may sequentially test a memory system's detecting of a data signal, where $V_{REF}$, $\Delta\phi_{DQ\text{-}DQS}$, and/or $\Delta\phi_1$ values are varied across the sequential testing.

In an embodiment, testing may include a first set of test rounds (and test stages) in a range of values for $V_{REF}$ and a range of values for $\Delta\phi_{DQ\text{-}DQS}$. By way of illustration, a first set of test operations may include one or more of a test stage 1_1a for a reference point at ($\Delta\phi_1$, $\Delta\phi_{DQ\text{-}DQS}$, $V_{REF}$) coordinates ($\phi_Y$, $\phi_W$, $V_1$), a test stage 1_1b for a reference point at ($\phi_Y$, $\phi_X$, $V_1$), a test stage 1_2a for a reference point at ($\phi_Y$, $\phi_W$, $V_2$) and a test stage 1_2b for a reference point at ($\phi_Y$, $\phi_X$, $V_2$). Such test stages for the $\Delta\phi_1 = \phi_Y$ plane of graph 600 are illustrative, and may include any of a variety of additional or alternative test rounds/stages.

Such testing may further include a second set of test rounds (and test stages), where the second set is for a different value of $\Delta\phi_1$. By way of illustration, the second set of test operations may include one or more of a test stage 2_1a for a reference point at ($\Delta\phi_1$, $\Delta\phi_{DQ\text{-}DQS}$, $V_{REF}$) coordinates ($\phi_Z$, $\phi_W$, $V_1$), a test stage 2_1b for a reference point at ($\phi_Z$, $\phi_X$, $V_1$), a test stage 2_2a for a reference point at ($\phi_Z$, $\phi_W$, $V_2$) and a test stage 2_2b for a reference point at ($\phi_Z$, $\phi_X$, $V_2$). Such test stages for the $\Delta\phi_1 = \phi_Z$ plane of graph 600 are illustrative, and may include any of a variety of additional or alternative test rounds (test stages). In an embodiment, each test stage may find the size of the ($\Delta\phi_{DQ\text{-}DQS}$, $V_{REF}$) offset before a failure is detected.

By performing test rounds in multiple ($\Delta\phi_{DQ\text{-}DQS}$, $V_{REF}$) planes—where each plane corresponds to a different value for $\Delta\phi_1$—a reference point in the ($\Delta\phi_1$, $\Delta\phi_{DQ\text{-}DQS}$, $V_{REF}$) space may be identified which is associated with a preferred operating state for the memory system being tested.

It should also be noted that the idea of testing for relative phase difference between individual signals can be extended to whole groups of multiple signals affecting one another. For example, a DDR bus is generally broken into 8 byte groups of (8 data bits+1 differential strobe). Within such a group, all signals have very similar timing—e.g. phase—but the timing between data groups can be very different. If these groups couple to each other, then techniques described herein can be applied to find the best relative phase between all of the different groups to maximize the minimal margin across all signals. Similarly, if a memory controller has multiple DDR channels coupling to each other, algorithms described herein can sweep the relative phases between all of the channels to find the best overall location. Analysis information generated by such algorithm may be used to control the relative phase between signal groups.

Figure 6B:
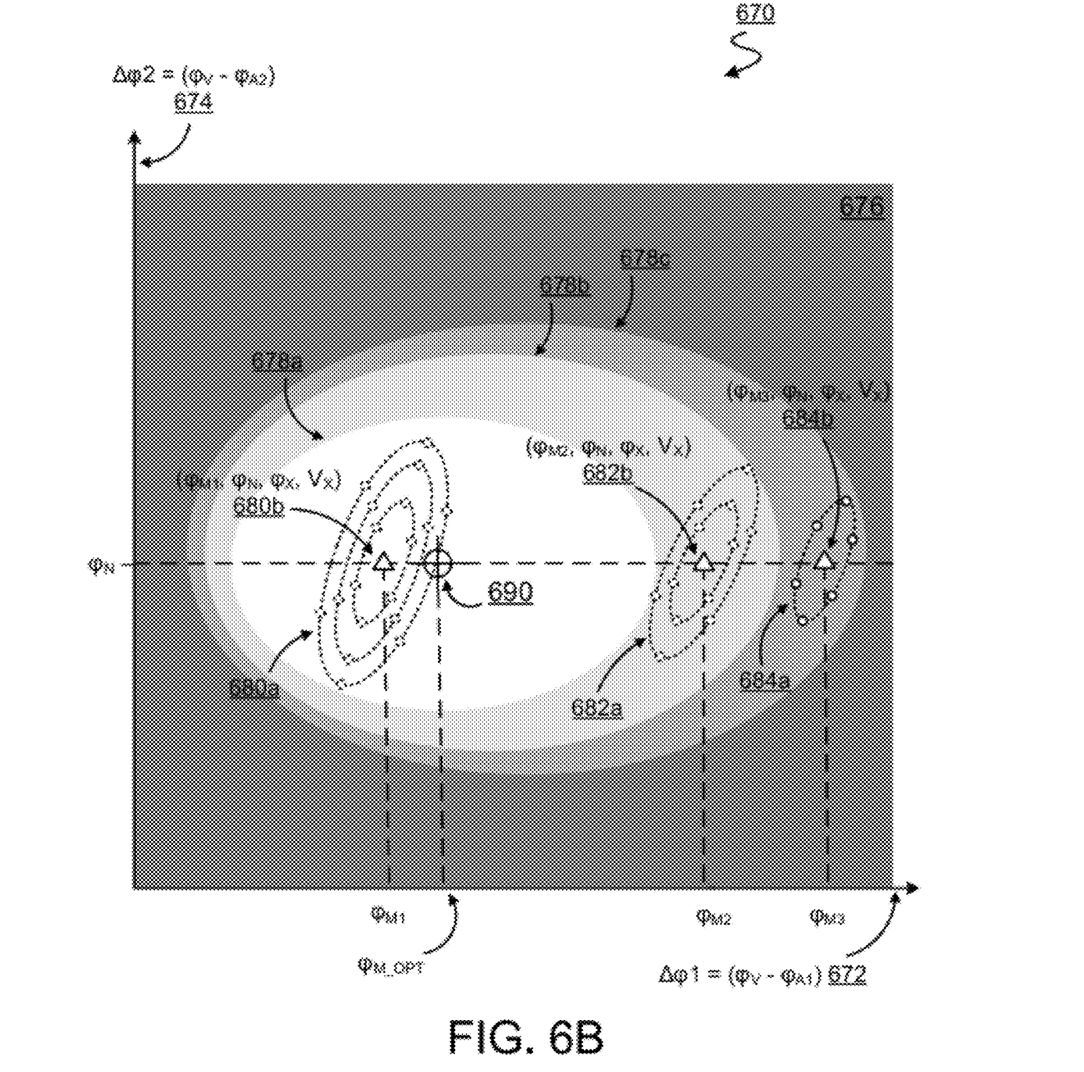
FIG. 6B is a graph illustrating a set of operating characteristics for which effects of signal phase difference may be tested according to an embodiment.

FIG. 6B illustrates select elements of a graph 670 describing a set of operating characteristics according to which effects of signal phase difference may be tested in an embodiment. Graph 670 may represent a selection of the parameters of an N-dimensional space—for example, as discussed above with respect to FIG. 4. Graph 670 includes a $\Delta\phi1$ axis 672 representing a range of values for a relative phase difference between a victim signal and a first aggressor signal. Graph 670 further includes a $\Delta\phi2$ axis 674 representing a range of values for a relative phase difference between the victim signal and a second aggressor signal.

As described above with respect to graph 600, testing may include multiple sets of test rounds (and test stages) in a range of values for $V_{REF}$ and a range of values for $\Delta\phi_{DQ\text{-}DQS}$. In an embodiment, a given set of test rounds may test performance of a memory system for a given set of operating states, where the operating states include various respective values for $\Delta\phi_{DQ\text{-}DQS}$ and $V_{REF}$, and where each of the operating states includes the same value for $\Delta\phi1$ and the same value $\Delta\phi2$.

A first set of test rounds 680a may be performed for a set of operating states which each include the condition $(\Delta\phi1, \Delta\phi2) = (\phi_{M1}, \phi_N)$. By way of illustration and not limitation, the first set of test rounds 680a may include testing for sampling points which are variously offset from some common N-dimensional reference point 680b including $(\Delta\phi1, \Delta\phi2, \Delta\phi_{DQ\text{-}DQS}, V_{REF}) = (\phi_{M1}, \phi_N, \phi_X, V_X)$. Although 680a is shown in graph 670 for illustrative purposes, it is understood that the various sample points for the first set of test rounds 680a may actually be offset from the reference point 680b only along (two or more) respective axes in the $(\Delta\phi_{DQ\text{-}DQS}, V_{REF})$ plane (not shown), which is orthogonal to the $(\Delta\phi1, \Delta\phi2)$ plane of graph 670.

Each test round in the first set of test rounds may contribute to generating test information for the common reference point 680b. For example, the first set of test rounds 680a may identify a largest offset of a sample point from reference point 680a. Such test information from the first set of test rounds 680a—along with similar test information from other sets of test rounds (not shown)—may be combined to identify a region 678a representing a set of operating states having a particular level of operational stability in the $(\Delta\phi_{DQ\text{-}DQS}, V_{REF})$ plane.

Alternatively or in addition to the first set of test rounds 680a, a second set of test rounds 682a may similarly be performed for a set of operating states which each include the condition $(\Delta\phi1, \Delta\phi2) = (\phi_{M2}, \phi_N)$. The second set of test rounds 682a may include testing for sampling points which are variously offset—e.g. in the $(\Delta\phi_{DQ\text{-}DQS}, V_{REF})$ plane—from some common reference point 682b including $(\Delta\phi1, \Delta\phi2, \Delta\phi_{DQ\text{-}DQS}, V_{REF}) = (\phi_{M2}, \phi_N, \phi_X, V_X)$. Test information from the second set of test rounds 682a may be used to identify a region 678b representing a set of operating states having another level of operational stability in the $(\Delta\phi_{DQ\text{-}DQS}, V_{REF})$ plane. In an embodiment, a largest sample point offset identified for second set of test rounds 682a may be smaller than the largest sample point offset identified for first set of test rounds 680a. Accordingly, region 678b may represent a level of operational stability in the $(\Delta\phi_{DQ\text{-}DQS}, V_{REF})$ plane which is less than that represented by region 678a.

Alternatively or in addition, a third set of test rounds 684a may similarly be performed for a set of operating states which each include the condition $(\Delta\phi1, \Delta\phi2) = (\phi_{M3}, \phi_N)$. The third set of test rounds 684a may include testing for sampling points which are variously offset—e.g. in the $(\Delta\phi_{DQ\text{-}DQS}, V_{REF})$ plane—from some common reference point 684b including $(\Delta\phi1, \Delta\phi2, \Delta\phi_{DQ\text{-}DQS}, V_{REF}) = (\phi_{M3}, \phi_N, \phi_X, V_X)$. Test information from the third set of test rounds 684a may be used to identify a region 678c representing a set of operating states having yet another level of operational stability in the $(\Delta\phi_{DQ\text{-}DQS}, V_{REF})$ plane. In an embodiment, a largest sample point offset identified for third set of test rounds 684a may be smaller than the largest sample point offset identified for second set of test rounds 682a. Accordingly, region 678c may represent a level of operational stability in the $(\Delta\phi_{DQ\text{-}DQS}, V_{REF})$ plane which is less than that represented by region 678b. A region 676 outside of the regions 678a, 678b, 678c may represent some unacceptably low level of operational stability in the $(\phi\Delta_{DQ\text{-}DQS}, V_{REF})$ plane.

The testing described above with respect to FIG. 6B may include any of a variety of additional or alternative sets of test rounds, each for a respective reference point in the $(\Delta\phi1, \Delta\phi2, \Delta\phi_{DQ\text{-}DQS}, V_{REF})$ space. The various reference points may correspond to different respective points in the $(\Delta\phi1, \Delta\phi2)$ plane of graph 670.

By performing multiple sets of test rounds and identifying various regions representing respective levels of operational stability—e.g. regions 678a, 678b, 678c—an optimal operation state may be identified for a memory device. For example, an operation point 690 including $(\Delta\phi1, \Delta\phi2, \Delta\phi_{DQ\text{-}DQS}, V_{REF}) = (\phi_{M\_OPT}, \phi_N, \phi_X, V_X)$ may be identified to provide for operation of a memory device which has a relatively optimal stability in the $(\Delta\phi_{DQ\text{-}DQS}, V_{REF})$ plane.

Figure 7:
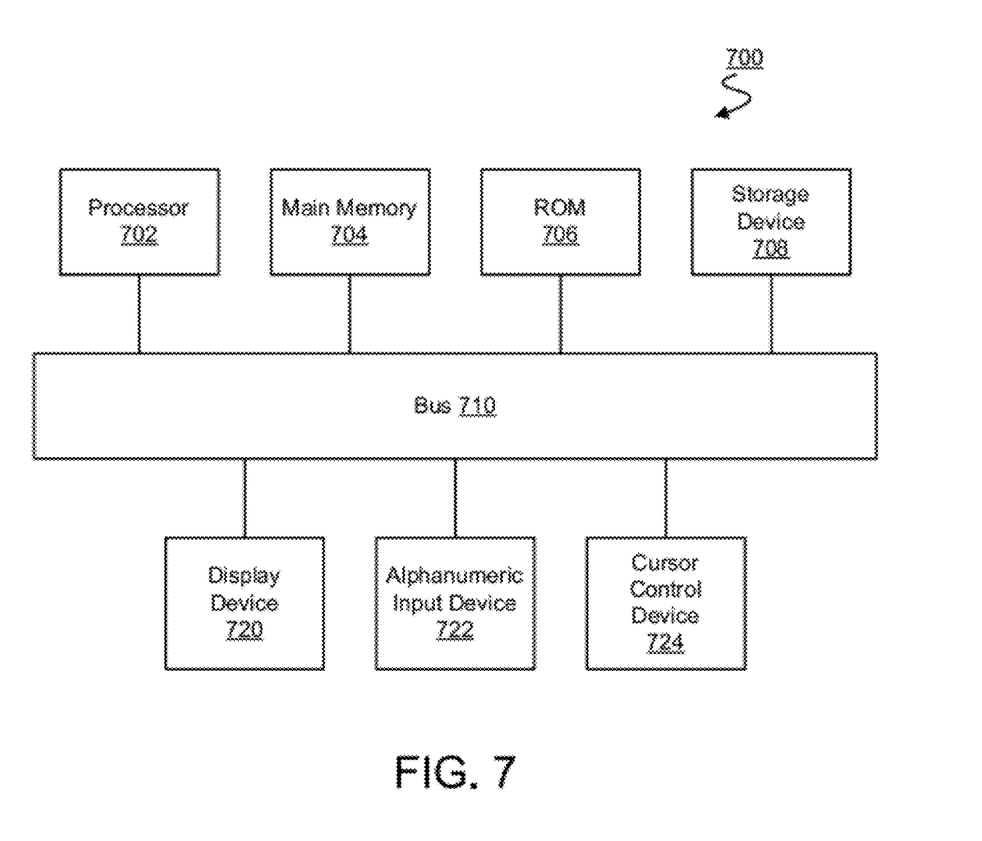
FIG. 7 is a block diagram illustrating select elements of a computer system according to an embodiment.

FIG. 7 is a block diagram of a computer system suitable for use in various embodiments. Computer system 700 comprises bus 710 or other device for communicating information, and processor 702 coupled with bus 710 for processing information. Computer system 700 further includes random access memory (RAM) or other dynamic storage device 704 (referred to as main memory), coupled to bus 710 for storing information and instructions to be executed by processor 702. Main memory 704 also can be used for storing temporary variables or other intermediate information during execution of instructions by processor 702. Computer system 700 also comprises read only memory (ROM) and/or other static storage device 706 coupled to bus 710 for storing static information and instructions for processor 702. Data storage device 708 is coupled to bus 710 for storing information and instructions.

Data storage device 708 such as magnetic disk or optical disc and corresponding drive can be coupled to computer system 700. Computer system 700 can also be coupled via bus 710 to display device 720, such as a cathode ray tube (CRT) or liquid crystal display (LCD), for displaying information to a computer user.

Alphanumeric input device 722, including alphanumeric and other keys, is typically coupled to bus 710 for communicating information and command selections to processor 702. Another type of user input device is cursor control 724, such as a mouse, a trackball, or cursor direction keys for communicating direction information and command selections to processor 702 and for controlling cursor movement on display 720.

In one embodiment, processor 702 and one or more of the components coupled to bus 702, such as main memory 704, are source synchronous components. Of course, any one or more components of computer system 700 can be source synchronous. Thus, computer system 700 can be either a partially source synchronous or fully source synchronous environment. In one embodiment, computer system 700 is a differential-strobe source synchronous system in which complementary strobe signals are communicated in parallel with data signals over the bus. Alternatively, computer system 700 is a single-strobe source synchronous system in which a single strobe signal is communicated in parallel with data signals over the bus.

Techniques and architectures for testing a memory system are described herein. In the above description, for purposes of explanation, numerous specific details are set forth in order to provide a thorough understanding of various embodiments. It will be apparent, however, to one skilled in the art that various embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some portions of the detailed descriptions herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Various embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, embodiments not described with reference to any particular programming language. It will be appreciated that a variety of programming languages may be used to implement the teachings of the embodiments as described herein.

Besides what is described herein, various modifications may be made without departing from the scope of various embodiments. Therefore, the illustrations and examples herein should be construed in an illustrative, and not a restrictive sense. The scope of the invention should be measured solely by reference to the claims that follow.

What is claimed is:

1. A system comprising:
   test logic to perform, with a signal generator and a phase controller, a first test round wherein:
      a memory system detects a first signal during a first operating state; and
      the memory system detects a second signal during a second operating state;
   wherein the first and second operating states correspond to different respective sample points of a plane which is defined by:
      a range of values for a first operating state parameter including a signal phase difference; and
      a range of values for another operating state parameter;
   wherein each of the corresponding sample points of the first and second operating states is offset from a first reference point of the plane along a different respective one of two axes in the plane which are oblique to one another, and wherein the test logic further to generate, based on the first test round, information related to operation of the memory system.

2. The system of claim 1, further comprising:
   a voltage controller to control a reference voltage provided to the memory system, and wherein the other operating state parameter includes the reference voltage.

3. The system of claim 1, wherein the signal phase difference includes one of:
   a relative phase difference between a victim signal and an aggressor signal; and
   a relative phase difference between a data signal and a data strobe signal associated with the data signal.

4. The system of claim 1, wherein the test logic to perform a plurality of test rounds including the first test round, each one of the plurality of test rounds associated with:
   a respective reference point of the plane; and
   two respective sample points of the plane, each of the two respective sample points offset from the respective reference point along a different one of two axes for the test round, where the two axes are oblique to one another; and
   each one of the plurality of test rounds including sequentially testing operation of the memory system for the two sample points of the plane associated with the test round.

5. The system of claim 4, wherein the first test round is a round in a first stage of a testing process, and wherein a second test round of the plurality of test rounds is a round of a second stage of the testing process, wherein the reference point associated with the second test round is different from the first reference point.

6. The system of claim 1, wherein the first test round further includes testing operation of the memory system for two additional sample points of the plane, where each of the two additional sample points is offset from the first reference point by a different respective one of the two axes for the first test round.

7. The system of claim 6, the testing operation of the memory system for the two additional sample points of the plane including:

applying a scale factor to respective data indicating previous sample points, the applying the scale factor to determine data indicating the two additional sample points.

8. A method comprising:
  performing a first test round wherein:
    a memory system detects a first signal during a first operating state; and
    the memory system detects a second signal during a second operating state;
  wherein the first and second operating states correspond to different respective sample points of a plane which is defined by:
    a range of values for a first operating state parameter including a signal phase difference; and
    a range of values for another operating state parameter;
  wherein each of the corresponding sample points of the first and second operating states is offset from a first reference point of the plane along a different respective one of two axes in the plane, where the two axes are oblique to one another; and
    based on the first test round, generating information related to operation of the memory system.

9. The method of claim 8, wherein the signal phase difference includes one of:
  a relative phase difference between a victim signal and an aggressor signal; and
  a relative phase difference between a data signal and a data strobe signal associated with the data signal.

10. The method of claim 8, wherein performing the first test round includes performing a plurality of test rounds, each one of the plurality of test rounds associated with:
  a respective reference point of the plane; and
  two respective sample points of the plane, each of the two respective sample points offset from the respective reference point along a different one of two axes for the test round, where the two axes for the test round are oblique to one another; and
  each performing of one of the plurality of test rounds including sequentially testing operation of the memory system for the two sample points of the plane associated with the test round.

11. The method of claim 8, wherein the first test round is a round in a first stage of a testing process, and wherein a second test round of the plurality of test rounds is a round of a second stage of the testing process, wherein the reference point associated with the second test round is different from the first reference point.

12. The method of claim 8, wherein performing the first test round further includes testing operation of the memory system for two additional sample points of the plane, where each of the two additional points is offset from the first reference point by a different respective one of the two axes for the first test round.

13. The method of claim 12, the testing operation of the memory system for the two additional points of the plane including:
  applying a scale factor to respective data indicating previous sample points, the applying the scale factor to determine data indicating the two additional sample points.

14. A computer-readable medium having stored thereon instructions which, when executed by one or more processors, cause the one or more processors to perform a method comprising:
  performing a first test round wherein:
    a memory system detects a first signal during a first operating state; and
    the memory system detects a second signal during a second operating state;
  wherein the first and second operating states correspond to different respective sample points of a plane which is defined by:
    a range of values for a first operating state parameter including a signal phase difference; and
    a range of values for another operating state parameter;
  wherein each of the corresponding sample points of the first and second operating states is offset from a first reference point of the plane along a different respective one of two axes in the plane, where the two axes are oblique to one another; and
    based on the first test round, generating information related to operation of the memory system.

15. The computer-readable medium of claim 14, wherein the signal phase difference includes one of:
  a relative phase difference between a victim signal and an aggressor signal; and
  a relative phase difference between a data signal and a data strobe signal associated with the data signal.

16. The computer-readable medium of claim 14, wherein performing the first test round includes performing a plurality of test rounds, each one of the plurality of test rounds associated with:
  a respective reference point of the plane; and
  two respective sample points of the plane, each of the two respective sample points offset from the respective reference point along a different one of two axes for the test round, where the two axes for the test round are oblique to one another; and
  each performing of one of the plurality of test rounds including sequentially testing operation of the memory system for the two sample points of the plane associated with the test round.

17. The computer-readable medium of claim 14, wherein the first test round is a round in a first stage of a testing process, and wherein a second test round of the plurality of test rounds is a round of a second stage of the testing process, wherein the reference point associated with the second test round is different from the first reference point.

18. The computer-readable medium of claim 14, wherein performing the first test round further includes testing operation of the memory system for two additional sample points of the plane, where each of the two additional points is offset from the first reference point by a different respective one of the two axes for the first test round.

19. The computer-readable medium of claim 18, the testing operation of the memory system for the two additional points of the plane including:
  applying a scale factor to respective data indicating previous sample points, the applying the scale factor to determine data indicating the two additional sample points.

* * * * *